(12) United States Patent
Okuyama et al.

(10) Patent No.: US 6,621,750 B2
(45) Date of Patent: Sep. 16, 2003

(54) SEMICONDUCTOR MEMORY

(75) Inventors: Yoshiaki Okuyama, Kawasaki (JP); Shinya Fujioka, Kawasaki (JP); Kota Hara, Kawasaki (JP); Katsuhiro Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/155,029

(22) Filed: May 28, 2002

(65) Prior Publication Data

US 2003/0090943 A1 May 15, 2003

(30) Foreign Application Priority Data

Nov. 12, 2001 (JP) ........................................ 2001-345945

(51) Int. Cl.$^7$ ................................................. G11C 7/00
(52) U.S. Cl. ................ 365/200; 365/225.7; 365/230.03
(58) Field of Search ............................. 365/200, 225.7, 365/230.03, 230.06

(56) References Cited

U.S. PATENT DOCUMENTS 5,293,348 A * 3/1994 Abe ........................... 365/200
6,172,929 B1 * 1/2001 Carson et al. ............. 365/225.7

* cited by examiner

*Primary Examiner*—Huan Hoang
(74) *Attorney, Agent, or Firm*—Arent Fox Kintner Plotkin & Kahn, PLLC (57) ABSTRACT

A redundancy memory circuit stores a defect address indicating a defective memory cell row. A redundancy control circuit disables the defective memory cell row corresponding to the defect address stored in the redundancy memory circuit and enables a redundancy memory cell row in the memory block containing the defective memory cell row. Moreover, in the other memory blocks, the redundancy control circuit disables memory cell rows corresponding to the defective memory cell row and enables redundancy memory cell rows instead of these memory cell rows. Consequently, not only the memory block having the defective memory cell row but one of the memory cell rows in the other memory blocks is always also relieved. Thus, the redundancy memory circuit can be shared among all the memory blocks with a reduction in the number of redundancy memory circuits. As a result, the semiconductor memory can be reduced in chip size.

13 Claims, 10 Drawing Sheets

SEMICONDUCTOR MEMORY

BACKGROUND OF THE INVENTION

1. Field of the Invention

The present invention relates to a semiconductor memory having a redundancy circuit for relieving defects in memory cells, 2. Description of the Related Art In general, semiconductor memories have redundancy circuits to relieve lattice defects in the substrates and defects that occur in the fabrication processes. For example, DRAMs and the like are provided with redundancy memory cell rows aside from regular memory cell rows. Semiconductor memories of this type, provided with redundancy memory cell rows, have fuse arrays for storing the addresses of memory cell rows that contain defective memory cells.

When some memory cells are defective, fuses in the fuse arrays are blown in advance according to the addresses of the memory cell rows containing the defective memory cells. The blowing of fuses disables the defective memory cell rows and enables the redundancy memory cell rows instead when the semiconductor memories are powered on. That is, the defective memory cells are relieved. In this way, the redundancy memory cells are used to relieve defective memory cells for the sake of improved yields.

As described above, the fuse arrays are used to replace defective memory cell rows with the redundancy memory cell rows. Consequently, in semiconductor memories provided with a plurality of memory blocks having redundancy memory cell rows, the fuse arrays are necessary for the respective memory blocks. Hence, the fuse arrays can increase in number when the semiconductor memories have greater numbers of memory blocks.

The fuses are blown by the irradiation of laser beams, and thus require considerably greater layout areas than such devices as transistors. Besides, adjoining fuses must be well spaced from each other. The number of fuse arrays therefore has a significant impact on the chip size of the semiconductor memories. If the fuse arrays are reduced in number so as to prevent the increase in chip size, there occur unrelievable memory blocks. This results in a problem of lower yields.

In addition, the fuse size depends chiefly on the precision of the laser irradiation apparatus and hardly on the semiconductor fabrication processes. Thus, the fuse size will not decrease even if the transistor structures get finer with advancing process technology. In other words, the further the process technology advances, the greater the fuse arrays become in area with respect to the chip area.

SUMMARY OF THE INVENTION

It is an object of the present invention to provide a semiconductor memory, which can be improved in relief efficiency with no increase of, fuse arrays.

Another object of the present invention is to reduce the chip size of a semiconductor memory having a redundancy circuit.

According to one of the aspects of the semiconductor memory of the present invention, the semiconductor memory includes a plurality of memory blocks operating at different timings from one another, a redundancy memory circuit, and a redundancy control circuit. Each of the memory blocks has a plurality of memory cell rows containing memory cells and a redundancy memory cell row containing redundancy memory cells. The redundancy memory cell row relieves a defective memory cell row which includes a defective memory cell out of the memory cell rows. The redundancy memory circuit stores a defect address (address information) indicating the defective memory cell row existing in any one of the memory blocks into its first memory unit. The first memory unit is composed of, for example, a plurality of fuses for storing respective bits of the defect address.

The redundancy control circuit receives the address information, and disables the defective memory cell row corresponding to the defect address stored in the redundancy memory circuit and enables the redundancy memory cell row instead of the defective memory cell row in the memory block containing the defective memory cell row. Moreover, in the other memory blocks, the redundancy control circuit disables memory cell rows corresponding to the defective memory cell row and enables the redundancy memory cell rows instead of these memory cell rows. Consequently, when the redundancy memory circuit contains a defect address, riot only the memory block having the defective memory cell row but one of the memory cell rows in the other memory blocks is always also relieved. The redundancy memory circuit can thus be shared among all the memory blocks with a reduction in the number of redundancy memory circuits. Despite the reduction in the number of redundancy memory circuits, there occurs no unrelievable memory block. In addition, when the redundancy memory circuit is composed of fuses, it is possible to significantly reduce the layout area thereof. As a result, the semiconductor memory can be reduced in chip size.

According to another aspect of the semiconductor memory of the present invention, the memory cell rows each include a selecting line for selecting the memory cells. The redundancy control circuit includes a first receiver circuit and a first switching circuit, which are formed in one of the memory blocks, and a second receiver circuit and a second switching circuit, which are formed in the rest of the memory blocks, respectively. The first receiver circuit receives the address information stored in the first memory unit firstly and directly. The first switching circuit disables one of the memory cell rows according to the address information received. The second receiver circuit receives the address information transmitted through the selecting line of the memory block, which has firstly and directly received the address information. The second switching circuit disables the memory cell rows according to the address information received.

In this way, the address information is transmitted by using the selecting lines of the memory blocks which are used in normal memory operations. The use of the existing signal lines eliminates the need to provide new wiring for transmitting the address information. Consequently, applying the present invention to any semiconductor memory causes no increase in the number of lines or increase in the chip size resulting from increased wiring According to another aspect of the semiconductor memory of the present invention, the address information transmitted to each of the memory blocks including the second receiver circuit is transmitted to another one of the memory blocks including the second receiver circuit through the selecting line. Thus, the use of the existing selecting lines allows the address information to be transmitted to all the memory blocks.

According to another aspect of the semiconductor memory of the present invention, the first receiver circuit, which receives the address information first, decodes the address information with its redundancy decoder. The decoding result (address information) is transmitted to the second receiver circuit through the selecting line. The address information received by the second receiver circuit is held in a latch. Hence, in the memory blocks which include the second, receiver circuits, the defective memory cell row can be disabled by using the stored address information after the address information is transmitted to a second receiver circuit of another memory block. In other words, the second receiver circuit need hot receive the address information directly from the redundancy memory circuit. As for the first receiver circuit, it need not store the address information since it always receives the address information from the redundancy memory circuit.

According to another aspect of the semiconductor memory of the present invention, the first and second switching circuits operate as transmission paths during a predetermined period at power-up, thereby transmitting the address information to the selecting line. Subsequently, the first and second switching circuits operate as switches, disabling the defective memory cell row according to the address information. That is, the first and second switching circuits can serve both as the transmission paths of the address information and the switches for disabling the defective memory cell row.

According to another aspect of the semiconductor memory of the present invention, the selecting line is a word line connected to transfer gates of the memory cells. The memory cell rows include a plurality of memory cells connected to word lines. Thus, the defective memory cell row is relieved in units of word lines. For example, when the word lines are composed hierarchically of main word lines and sub word lines, the address information is transmitted through the main word lines.

According to another aspect of the semiconductor memory of the present invention, the memory blocks are aligned in a wiring direction along the selecting line. One of the memory blocks including the first receiver circuit is positioned closer to the redundancy memory circuit than the rest of the memory blocks. Thus, the address information output from the redundancy memory circuit is transmitted only in one direction through the selecting line. Consequently, the layout region of the wiring for transmitting the address information between the memory blocks can be minimized, with a reduction in the chip size of the semiconductor memory.

According to another aspect of the semiconductor memory of the present invention, the redundancy memory cell row includes a redundancy selecting line for selecting the redundancy memory cells. The redundancy memory circuit includes a second memory unit for storing relief information indicating that the first memory unit stores the address information. The redundancy control circuit includes a third receiver circuit and a third switching circuit, which are formed in one of the memory blocks having the first receiver circuit, and a fourth receiver circuit and a fourth switching circuit, which are respectively formed in the memory blocks each having the second receiver circuit. The third receiver circuit receives the relief information stored in the redundancy memory circuit firstly and directly. The third switching circuit enables the redundancy memory cell row according to the relief information received. The fourth receiver circuit receives the relief information transmitted through the redundancy selecting line of the memory block, which has firstly and directly received the relief information. For example, the relief information is transmitted to the memory blocks each including the fourth receiver circuit through the redundancy selecting line. The fourth switching circuit enables the redundancy memory cell row according to the relief information received.

In this way, the relief information is transmitted by using the redundancy selecting lines of the memory blocks, which are used in normal memory operations. The use of the existing signal lines eliminates the need to provide new wiring for transmitting the relief information. Consequently, applying the present invention to any semiconductor memory causes no increase in the number of signal lines or increase in the chip size resulting from increased wiring.

According to another aspect of the semiconductor memory of the present invention, the fourth receiver circuit includes a latch for holding the relief information transmitted through the redundancy selecting line. Hence, in the memory blocks which include the fourth receiver circuits, the redundancy memory cell rows can be enabled by using the stored relief information after the relief information is transmitted to a fourth receiver circuit of another memory block.

According to another aspect of the semiconductor memory of the present invention, the third and fourth switching circuits operate as transmission paths during a predetermined period at power-up, thereby transmitting the relief information to the redundancy selecting line Subsequently, the third and fourth switching circuits operate as switches, enabling the redundancy memory cell row according to the relief information. That is, the third and fourth switching circuits can serve both as the transmission paths of the relief information and the switches for enabling the redundancy memory cell rows.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Hereinafter, an embodiment of the present invention will be described with reference to the drawings. In the drawings, each thick line represents a signal line that consists of a plurality of lines.

Figure 1:
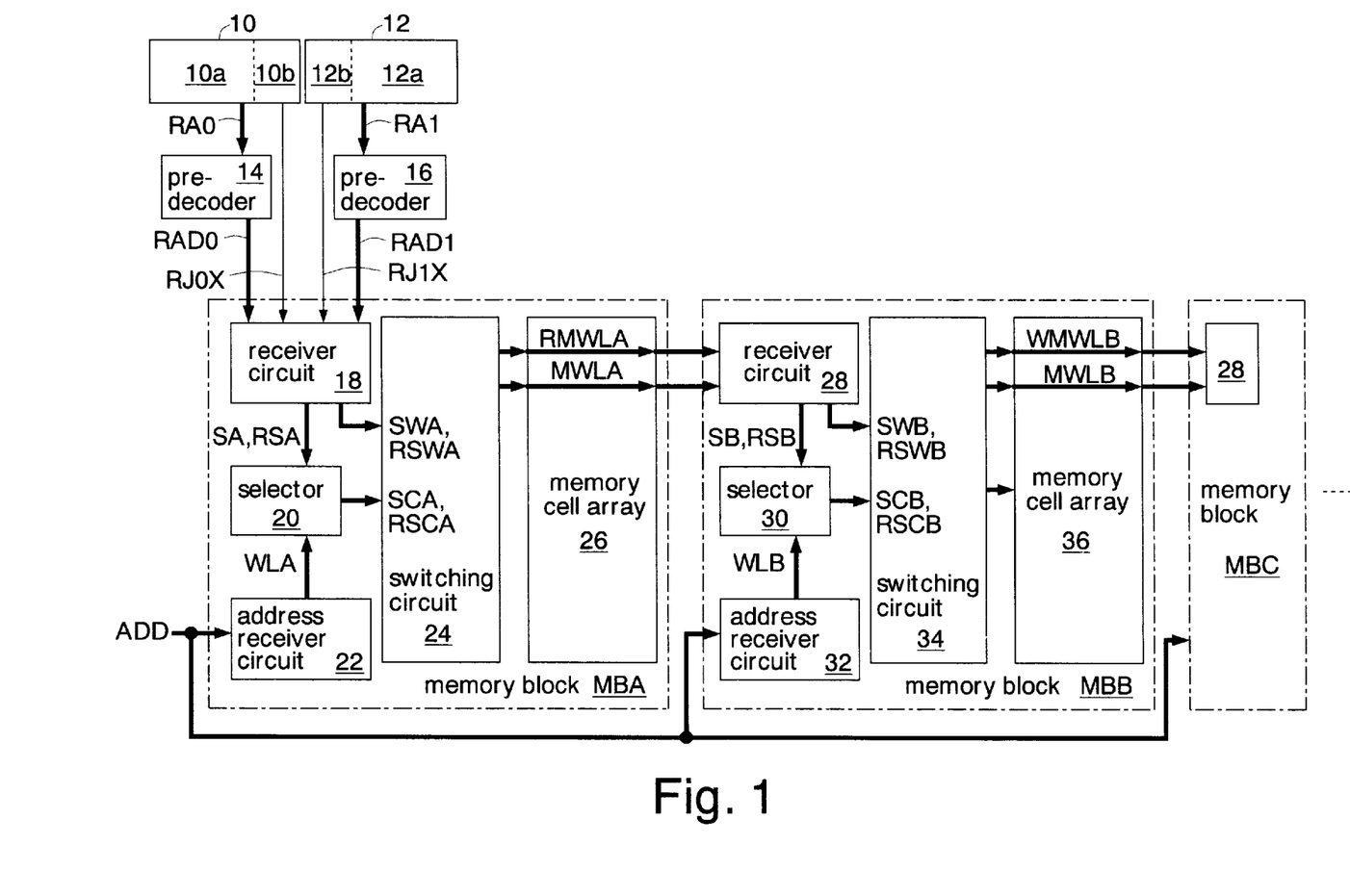
FIG. 1 is a block diagram showing an embodiment of the semiconductor memory of the present invention.

FIG. 1 shows an embodiment of the semiconductor memory of the present invention. This semiconductor memory is formed as a DRAM on a silicon substrate by using CMOS processes.

The DRAM comprises fuse arrays 10 and 12 (redundancy memory circuits) having a plurality of fuses each, predecoders 14 and 16, and a plurality of memory blocks MB (MBA, MBB, MBC, . . . ). Aside from those shown in the diagram, the DRAM also includes input circuits of an address signal and a command signal, an input/output circuit of a data signal, a command decoder, control circuits for controlling the memory blocks, and the like.

The fuse array 10 has a first memory unit 10a and a second memory unit 10b. The first memo unit 10a has six fuses for programming the respective bits of a 6-bit address that designates a defective memory cell row containing a defective memory cell. The first memory unit 10a outputs the programmed content as a 6-bit redundancy address signal RA0 (address information). The second memory unit 10b has a fuse for indicating that the first memory unit 10a is programmed with address information. The second memory unit 10b outputs the programmed content as a 1-bit redundancy signal RJ0X (relief information).

Similarly, the fuse array 12 has a first memory unit 12a and a second memory unit 12b. The first memory unit 12a has six fuses for programming the respective bits of a 6-bit address that designates another defective memory cell row containing a defective memory cell. The first memory unit 12a outputs the programmed content as a 6-bit redundancy address signal RA1 (address information). The second memory unit 12b has a fuse for indicating that the first memory unit 12a is programmed with address information. The second memory unit 12b outputs the programmed content as a 1-bit redundancy signal RJ1X (relief information).

The redundancy address signals RA0, RA1 and the redundancy signals RJ0X, RJ1X are shared among the plurality of memory blocks MB. This commonality of the fuse arrays 10 and 12 among all the memory blocks MB can reduce the numbers of fuses. The fuse arrays are composed of fuses, which are greater than such devices as transistors in layout size. Consequently, the chip size of the DRAM decreases significantly because of the reduction in the number of fuse arrays. Despite the reduction in the number off use arrays, there will occur no memory block MB that is unrelievable. In this embodiment, the fuse arrays 10 and 12 can relieve two defective memory cell rows out of the memory cell rows in the plurality of memory blocks MB.

The predecoder 14 receives the 6-bit redundancy address signal RA0, and generates a signal of positive logic and a signal of negative logic with respect to each of the bits. These signals are output as a redundancy decoding signal RAD0. Like the predecoder 14, the predecoder 16 receives the 6-bit redundancy address signal RA1 and outputs a redundancy decode signal RAD1 which contain signals of positive logic and negative logic with respect to each of the bits.

The memory blocks MBA has a receiver circuit 18, a selecting circuit 20, an address receiver circuit 22, a switching circuit 24, and a memory cell array 26. The memory blocks MBB has a receiver circuit 28, a selecting circuit 30, an address receiver circuit 32, a switching circuit 34, and a memory cell array 36. The selecting circuit 30, the address receiver circuit 32, the switching circuit 34, and the memory cell array 36 are the same circuits as the selecting circuit 20, the address receiver circuit 22, the switching circuit 24, and the memory cell array 26 of the memory block MBA. That is, the memory block MBB has the receiver circuit 28 instead of the receiver circuit 18 of the memory block MBA. The memory block MBC and the subsequent memory blocks (not shown) are identical to the memory block MBB in configuration. The receiver circuits 18 and 28, the selecting circuits 20 and 30, and the switching circuits 24 and 34 operate as a redundancy control circuit for disabling defective memory cell rows and enabling redundancy memory cell rows instead of the defective memory cell rows.

The memory blocks MB (MBA, MBB, MBC, . . . ) are arranged in a row along the wiring direction of main word lines MWL (MWLA, MWLB, . . . ) and redundancy main word lines RMWL (RMWLA, RMWLB, . . . ) to be described later. The memory block MBA, which has the receiver circuit 18, is positioned closest to the fuse arrays 10 and 12. The address information and the relief information, as will be described later, are transmitted to the plurality of memory blocks MB through the existing word lines MWL and RMWL. This eliminates the need for new wiring for transmitting the address information and the relief information. Moreover, arranging the memory blocks MB in a row along the word lines MWL and RMWL minimizes the layout region of the wiring for transmitting the address information and the relief information between the memory blocks MB.

The receiver circuit 18 receives the redundancy decoding signals RAD0, RAD1 and the redundancy signals PJ0X, RJ1X, and outputs redundancy setting signals SA, RSA and switching signals SWA, RSWA. The selecting circuit 20 outputs the redundancy setting signals SA, RSA or a word line selecting signal WLA as switching control signals SCA, RSCA.

The address receiver circuit 22 decodes a decoding signal ADD of an address signal to be supplied in read, write, and refresh operations, and outputs the word line selecting signal WLA.

The switching circuit 24 transmits the switch control signal SCA (address information) and the switch control signal RSCA (relief information) to the main word line MWLA and the redundancy main word line RMWLA of the memory cell array 26, respectively. The selecting circuit 24 also connects the output of the address receiver circuit 22 to the main word line MWLA depending on the switching signals SWA and RSWA.

The memory cell array 26 has 64 memory cell rows and two redundancy memory cell rows (will be described in conjunction with FIG. 2 to be seen later). The main word line MWLA and the redundancy main word line RMWLA are connected to the receiver circuit 28 in the adjoining memory block MBB.

The receiver circuit 28 holds the address information transmitted through the main word line MWLA (or MWLB) and outputs this address information as a redundancy setting signal SB and a switching signal SWB. The receiver circuit 28 also holds the relief information transmitted through the redundancy word line RMWLA (or RMWLB) and outputs this relief information as a redundancy setting signal RSB and a switching signal RSWB. The selecting circuit 30 outputs the redundancy setting signals SB, RSB or a word line selecting signal WLB as switching control signals SCB, RSCB. The address receiver circuit 32 decodes the decoding signal ADD of the address signal and outputs the word line selecting signal WLB.

The switching circuit 34 transmits the switch control signal. SCB (address information) and the switch control signal RSCB (relief information) to the main word lines.

MWLB and the redundancy main word lines RMWLB of the memory cell array 36, respectively. The selecting circuit 34 also connects the output of the address receiver circuit 32 to the main word lines MWLB depending on the switching signals SWB and RSWB.

The memory cell array 36 is identical to the memory cell array 26 in configuration, having a plurality of memory cell rows and two redundancy memory cell rows. The main word lines MWLB and the redundancy main word lines RMWLB are connected to the receiver circuit 28 in the adjoining memory block MBC.

Figure 2:
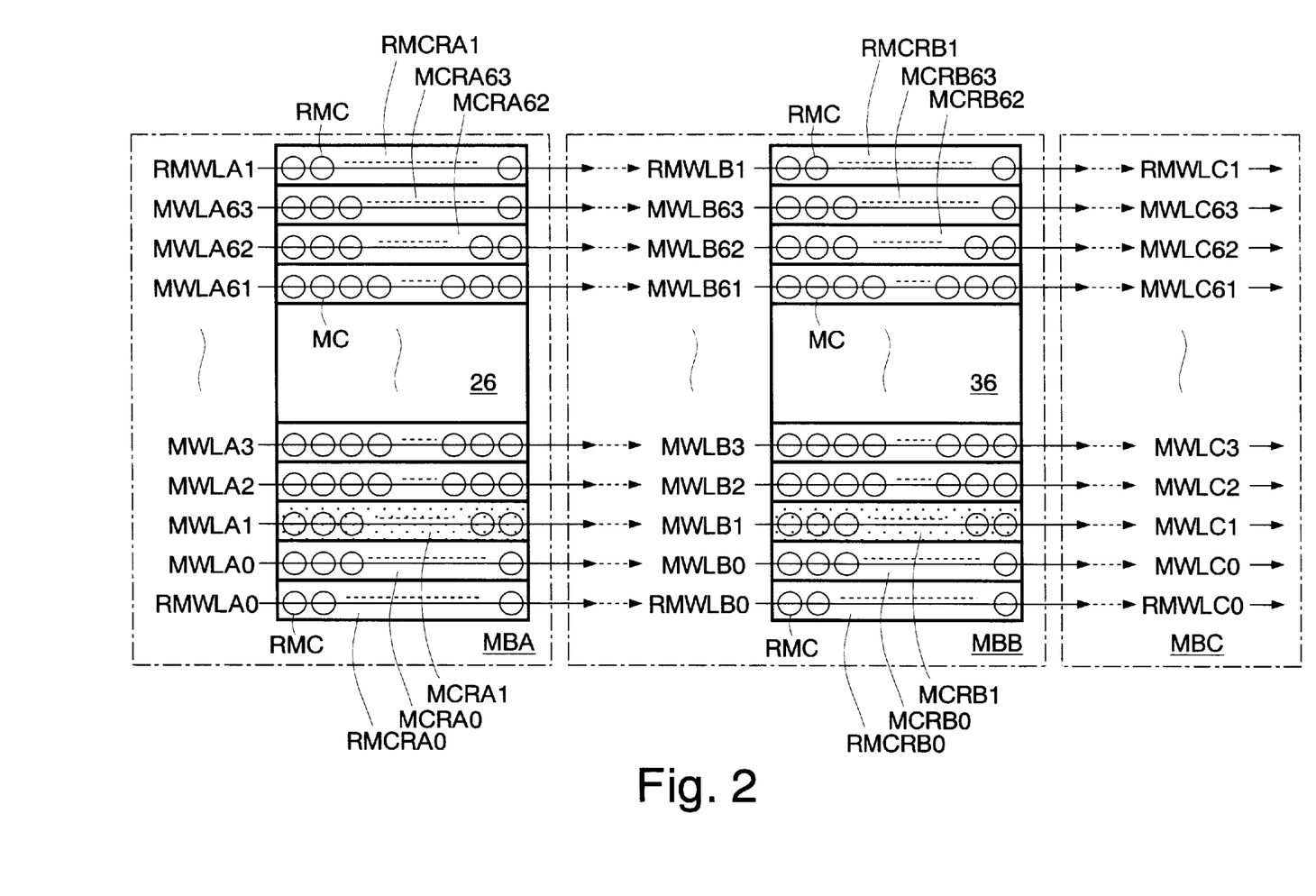
FIG. 2 is a block diagram showing an overview of the memory cell arrays of FIG. 1.

FIG. 2 shows the details of the memory cell arrays 26 and 36 shown in FIG. 1.

The memory cell array 26 has 64 memory cell rows MCRA0-63 and redundancy memory cell rows RMCRA0-1 which are arranged astride the layout region of these memory cell rows MCRA0-63 (on the top and bottom, in the diagram). The memory cell rows MCRA0-63 are provided with a plurality of memory cells MC and main word lines MWLA0-63 (selecting lines) for selecting these memory cells MC. The main word lines MWLA0-63 are connected to the transfer gates (not shown) of the memory cells MC. The redundancy memory cell rows RMCRA0-1 are provided with a plurality of redundancy memory cells RMC and redundancy main word lines RMWLA0-1 (redundancy selecting lines) for selecting these redundancy memory cells RMC. The redundancy main word lines RMWLA0-1 are connected to the transfer gates (not shown) of the redundancy memory cells RMC.

The memory cell array 36 contains memory cell rows MCRB0-63 wired with main word lines MWLB0-63 and redundancy memory cell rows RMCRB0-1 wired with redundancy main word lines RMWLB0-1. The memory cell rows MCRB0-63 and the redundancy memory cell rows RMCRB0-1 are formed at positions corresponding to the memory cell rows MCRA0-63 and the redundancy memory cell rows RMCRA0-1, respectively. That is, the main word lines MWLB0-63 and the redundancy main word lines RMWLB0-1 are formed on the extensions of the main word lines MWLA0-63 and the redundancy main word lines RMWLA0-1, respectively.

As described above, the memory cell arrays 26 and 36 are identical to each other in configuration, and have the same memory capacity. The memory cell arrays 26 and 36 are given addresses different from each other. Consequently, the memory blocks MBA and MBB having the memory cell arrays 26 and 36 operate in different timing from each other. In other words, the memory blocks MBA, MBB, MBC . . . operate independently, so that read operations or write operations on the memory cell rows MCRA, MCRB, MCRC . . . will not be started at the same time.

Moreover, the address designating the main word line MWLA0 of the memory cell array 26 and the address designating the main word line MWLB0 of the memory cell array 36 have some common bits. Similarly, the addresses designating the main word lines MWLA1-63 and the addresses designating the main word lines MWLB1-63 have some common bits, respectively. The fuse array 10 (or 12) is therefore programmed with the same address information when relieving memory cell rows that end in an identical number (for example, MRCA1 and MRCB1 which are shown shaded).

Figure 3:
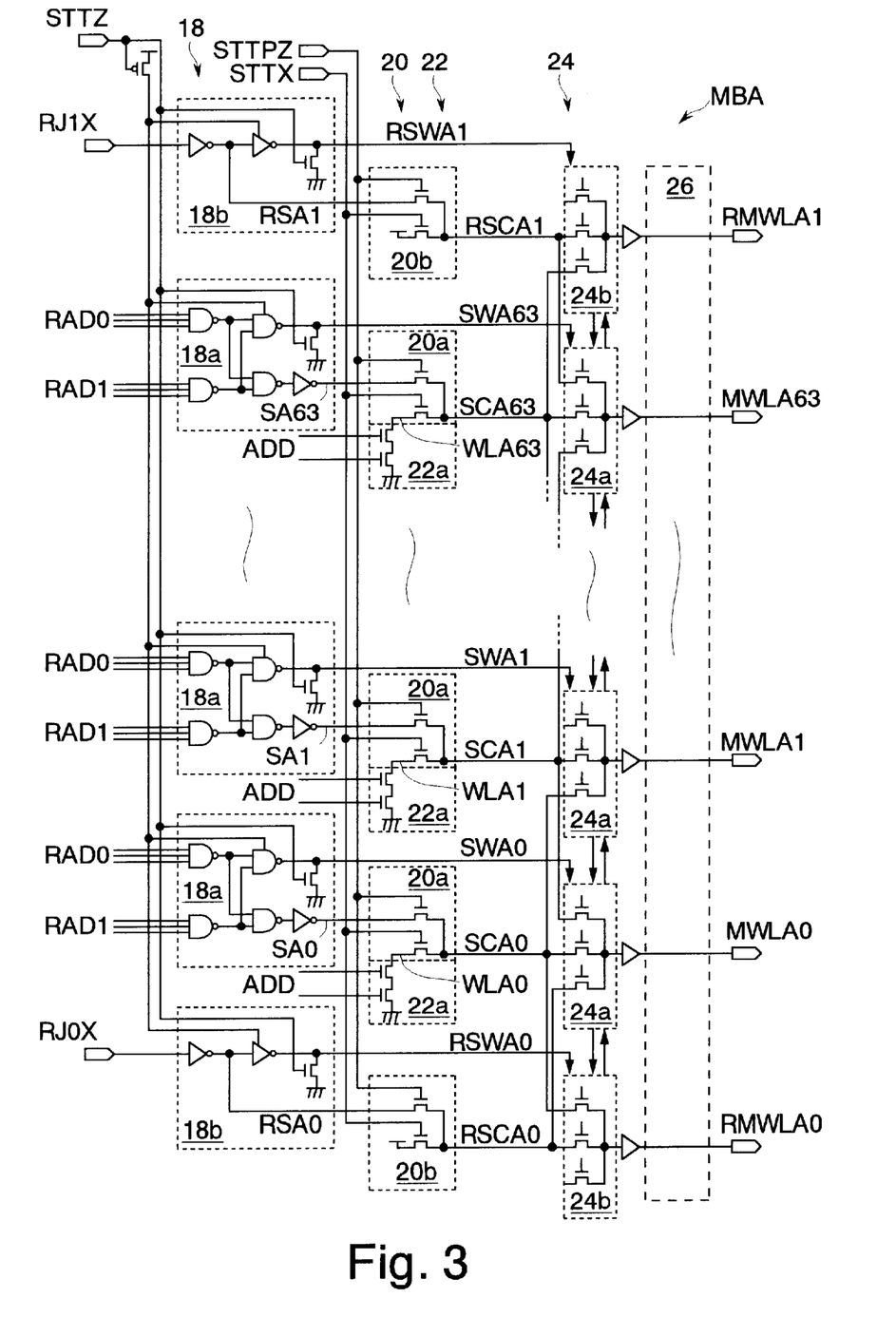
FIG. 3 is a circuit diagram showing the details of the memory block MBA of FIG. 1

FIG. 3 shows the details of the memory block MBA shown in FIG. 1.

The receiver circuit 18 has first receiver circuits 18a corresponding to the main word lines MWLA0-63, respectively, and third receiver circuits 18b corresponding to the redundancy main word lines RMWLA0-1, respectively. The first receiver circuits 18a each have a first NAND gate for receiving three bits of the redundancy decoding signal RAD0, a second NAND gate for receiving three bits of the redundancy decoding signal RAD1, a third NAND gate and an AND circuit for receiving the outputs of the first and second NAND gates, and an nMOS transistor connected to the output of the third NAND gate. The first and second NAND gates operate as a redundancy decoder for decoding the address information. The third NAND gate is activated when a start signal STTZ is at low level, thereby outputting a switching signal (SWA0-63). The nMOS transistor connects the output of the third NAND gate to a ground line when the start signal STTZ is at high level. The AND circuit outputs a redundancy setting signal SA.

Third receiver circuits 18b each have a first inverter for inverting the redundancy signal PJ0X (or RJ1X) and outputting the resultant as a redundancy setting signal RSA (RSA0-1), a second inverter for inverting the redundancy setting signal RSA and outputting the resultant as a switching signal RSWA (RSWA0-1), and an nMOS transistor connected to the output of the second inverter. The second inverter is activated when the start signal STTZ is at low level. The nMOS transistor connects the output of the second inverter to the ground line when the start signal STTZ is at high level.

The selecting circuit 20 has selectors 20a corresponding to the main word lines MWLA0-63, respectively, and selectors 20b corresponding to the redundancy main word lines RMWLA0-1, respectively. The selectors 20a output the redundancy setting signals SA (SA0-63) as the switch control signals SCA (SCA0-63) when a start signal STTPZ is at high level, and output the word line selecting signals WLA as the switch control signals SCA when a start signal STTX is at high level. The selectors 20b output the redundancy setting signals RSA as the switch control signals SCA when the start signal STTPZ is at high level, and output high level when the start signal STTX is at high level.

Here, the start signal STTZ is a signal that changes to high level for a predetermined period at power-up. The start signal STTX is the start signal STTZ inverted in logic. The start signal STTPZ is one that changes to high level in a later stage of the period over which the start signal STTZ is at high level. The start signals STTZ, STTX, and STTPZ are generated, for example, by a power-on resetting circuit, which operates at power-up.

The address receiver circuit 22 has address decoders 22a corresponding to the main word lines MWLA0-63, respectively. The address decoders 22a decode the decoding signals ADD of the address and output the resultant as the word line selecting signals WLA (WLA0-63). The address receiver circuit 22 decodes address signals in read, write, and refresh operations of the DRAM. That is, the address receiver circuit 22 is an address decoder for use in normal operations.

The switching circuit 24 has first switching circuits 24a corresponding to the main word lines MWLA0-63, respectively, and third switching circuits 24b corresponding to the redundancy main word lines RMWLA0-1, respectively. The first switching circuits 24a and the third selecting circuits 24b each have three nMOS transistors and a control circuit (not shown) for controlling these nMOS transistors. The nMOS transistors are connected to the outputs of the adjacent selectors 20a (or 20b) at either of their input/output nodes, and connected to the main word line MWLA at the other of the input/output nodes via buffers, The first switching circuits 24a establish connections between the outputs of the selectors 20a connected to the central nMOS transistors and the main word lines MWLA when the switching signals SWA are at low level. When the switching signals SWA are at high level, the first switching circuits 24a establish connections between any of the outputs of the selectors 20a, 20b connected to their three nMOS transistors and the main word lines MWLA, depending on the switching signals SWA and status signals output from the adjacent first switching circuits 24a (or third switching circuits 24b).

The third switching circuits 24b establish connections between the outputs of the selectors 20b connected to their central nMOS transistors and the redundancy word lines RMWLA when the switching signals RSWA are at low level. When the switching signals RSWA are at high level, the third switching circuits 24b establish connections between either of the outputs of the selectors 20a, 20b and the redundancy word lines RMWLA.

Figure 4:
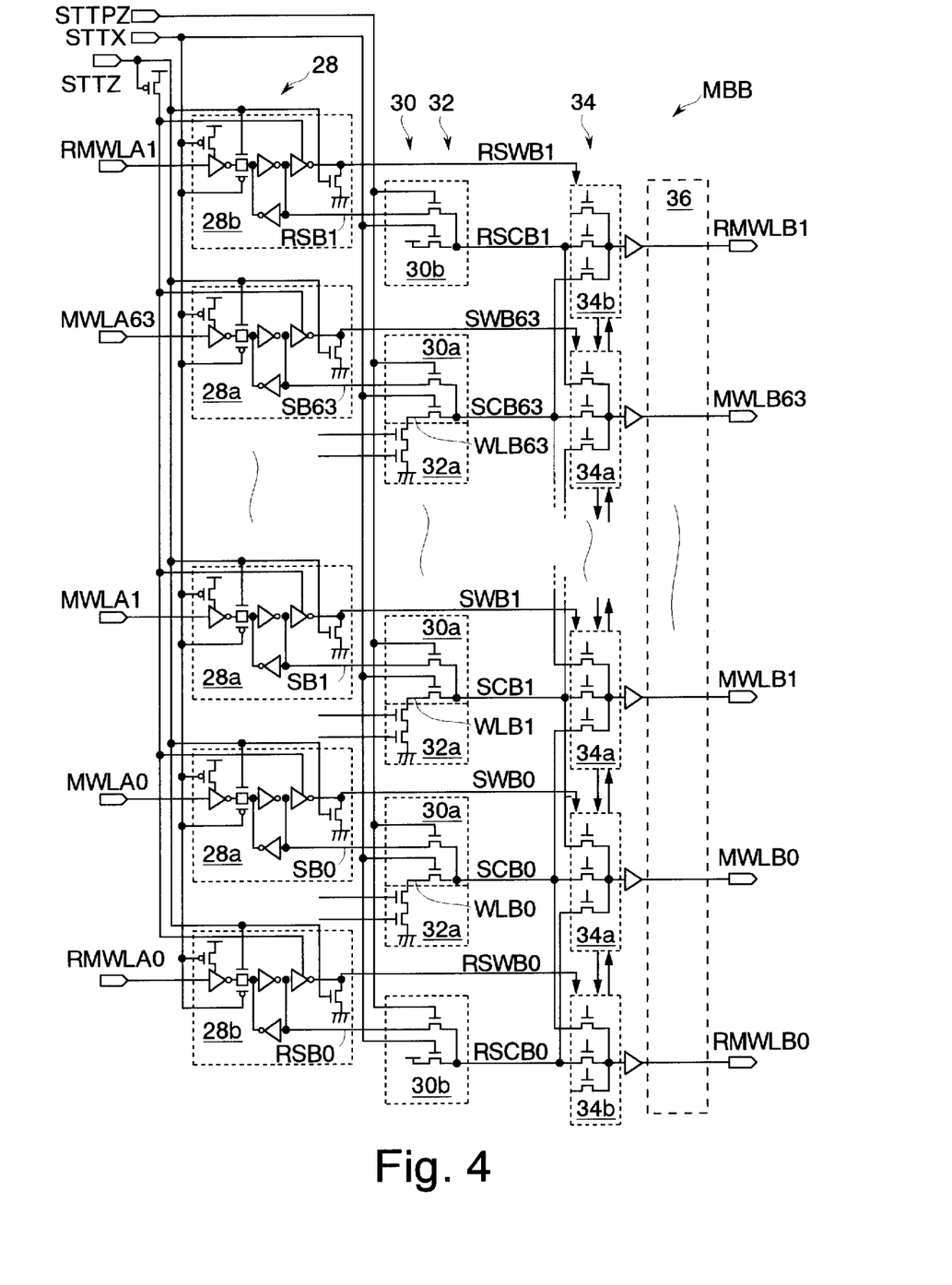
FIG. 4 is a circuit diagram showing the details of the memory block MBB of FIG. 1.

FIG. 4 shows the details of the memory block MBB shown in FIG. 1.

The receiver circuit 28 has second receiver circuits 28a corresponding to the main word lines MWLB0-63, respectively, and fourth receiver circuits 28b corresponding to the redundancy main word lines RMWLB0-1, respectively. Since the second receiver circuits 28a and the fourth receiver circuits 28b are identical in configuration, the following description will deal with the second receiver circuits 28a alone.

The second receiver circuits 28a each have a first inverter for receiving the main word line MWLA (MWLA0-63), a CMOS switch for receiving the output of the first inverter, a latch for latching the output of the first inverter through the CMOS switch, a second inverter for receiving the output of the latch, and an nMOS transistor connected to the output of the second inverter. The first inverter is activated when the start signal STTX is at low level. The CMOS switch turns on when the start signal STTZ is at high level. The second inverter is activated when the start signal STTZ is at low level. The nMOS transistor connects the output of the second inverter to the ground line when the start signal STTZ is at high level.

The selecting circuit 30 has selectors 30a corresponding to the main word lines MWLB0-63, respectively, and selectors 30b corresponding to the redundancy main word lines RMWLB0-1, respectively. Since the selectors 30a and 30b have the same configuration as that of the selectors 20a and 20b in the memory block MBA, respectively, description thereof will be omitted.

The address receiver circuit 32 has address decoders 32a corresponding to the main word lines MWLB0-63, respectively. Since the address decoders 32a have the same configuration as that of the address decoders 22a in the, memory block MBA, description thereof will be omitted.

The switching circuit 34 has second switching circuits 34a corresponding to the main word lines MWLB0-63, respectively, and fourth switching circuits 34b corresponding to the redundancy main word lines RMWLB0-1, respectively. Since the second switching circuits 34a and the fourth switching circuits 34b have the same configuration as that of the first switching circuits 24a and the third switching circuits 24b in the memory block MBA, respectively, description thereof will be omitted.

Figure 5:
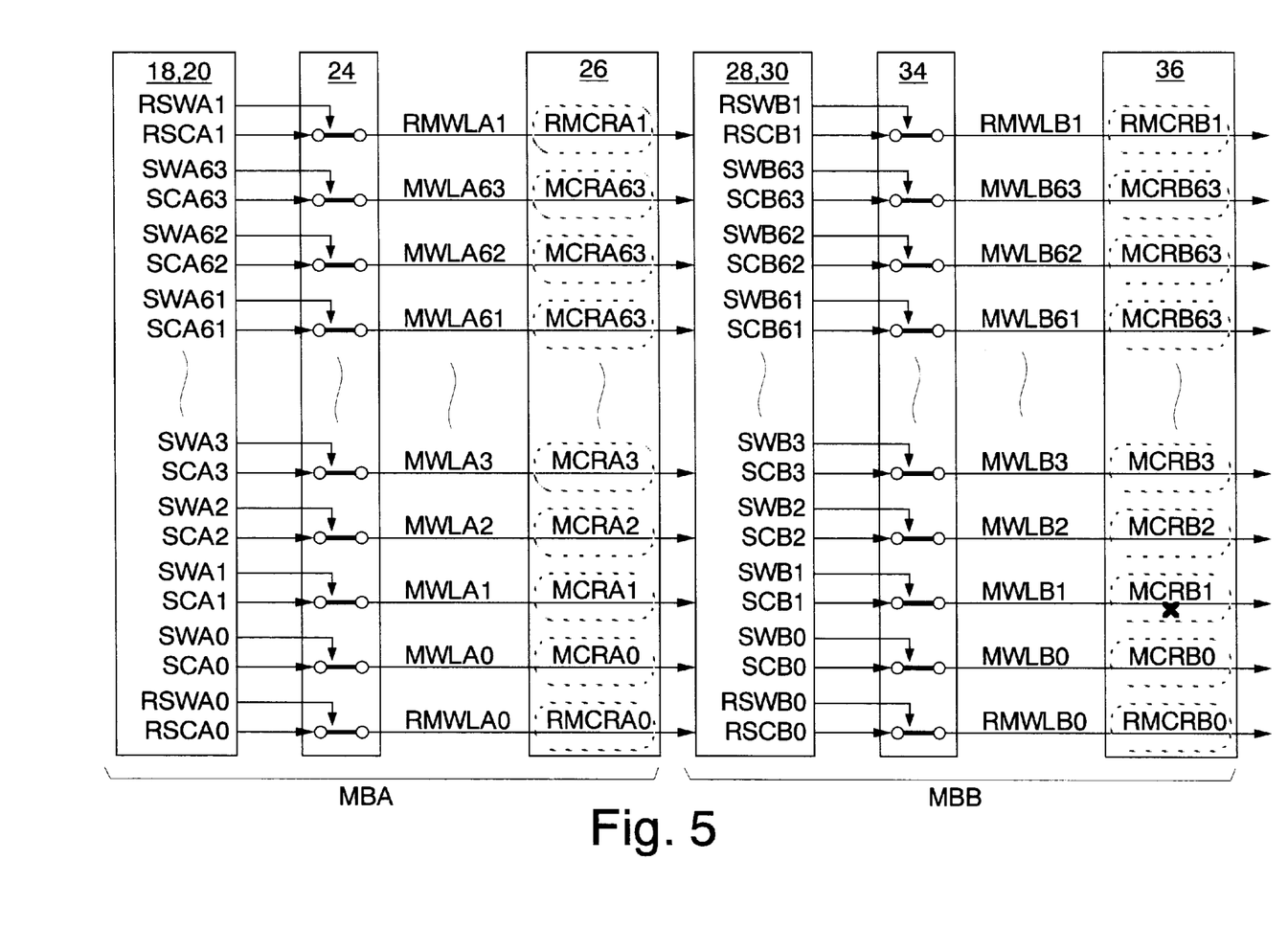
FIG. 5 is an explanatory diagram showing a state where the memory block MBB suffers a defect.

FIG. 5 shows a state where the memory block MBB suffers a defective memory cell (indicated with a cross in the diagram). In this example, the memory block MBB suffers a defective memory cell in the memory cell row MCRB1 that is wired with the main word line MWLB1. Here, in the fabrication process, the fuse array 10 shown in FIG. 1 is programmed with the address that designates the memory cell row MCRB1 (defective memory cell row) containing the defective memory cell. Since the other memory cells MC have no defect, the fuse array 12 is not programmed.

Figure 6:
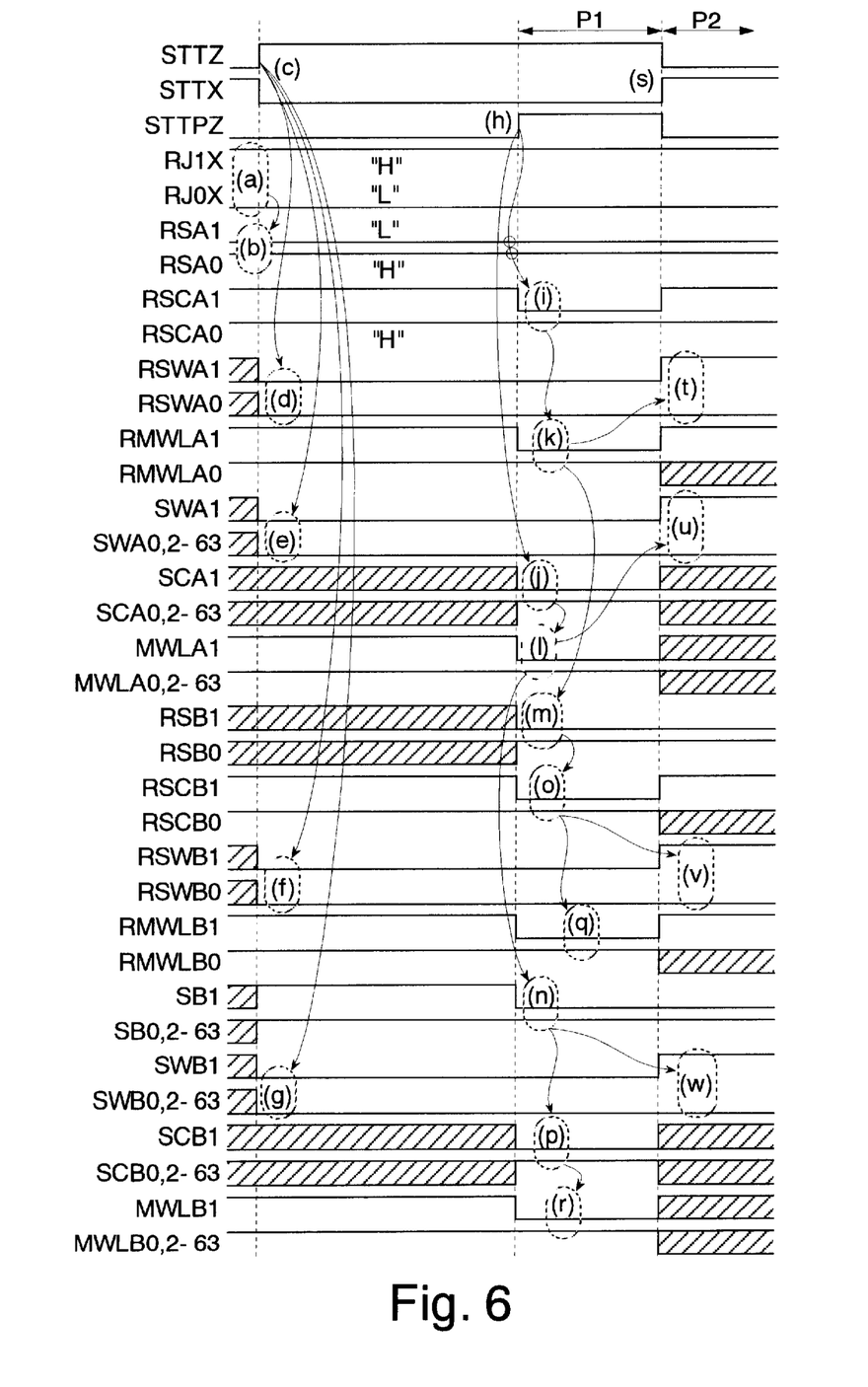
FIG. 6 is a timing chart showing the operation for relieving the defective memory cell row.

FIG. 6 shows the operation for relieving the defective memory cell row MCRB1 shown in FIG. 5. This operation is performed during a predetermined period at power-up. In this embodiment, the address information and the relief information are transmitted to adjoining memory blocks MB in a period P1 where the start signal STTPZ is at high level. In the subsequent period P2, the switching circuits 24 and 34 operate to relieve the defective memory cell row MCRB1.

In this example, the address of the defective memory cell row MCRB1 is programmed into the fuses of the first memory unit 10a (FIG. 1) in advance. Consequently, the first memory unit 10a outputs the address information designating the defective memory cell row MCRB1 as the redundancy address signal RA0 (not shown). Besides, the fuse of the second memory unit 10b is blown to indicate that the fuse array 10 is programmed with the address of the defective memory cell row MCRB1. The second memory unit 10b thus outputs the redundancy signal RJ0X of low level as the relief information. Since the first memory unit 12a is not programmed, the fuse of the second memory unit 12b is not blown. The second memory unit 12b thus outputs the redundancy signal RJ1X of high level (FIG. 6(a)).

The first receiver circuit 18a (FIG. 3) corresponding to the main word line MWLA1 receives the redundancy decoding signal RAD0 (the address information supplied through the predecoder 14) directly, and outputs the redundancy setting signal SA1 of low level (not shown). The first receiver circuits 18a corresponding to the main word lines MWLA0, 2-63 output the redundancy setting signals SA0, 2-63 of high level, respectively (not shown).

The third receiver circuit 18b corresponding to the redundancy main word line RMWLA0 receives the redundancy signal RJ0X (relief information) of low level directly, and outputs the redundancy setting signal RSA0 of high level. The third receiver circuit 18b corresponding to the redundancy main word line RMWLA1 outputs the redundancy setting signal RSA1 of low level (FIG. 6(b)).

Next, the start signals STTZ and STTX change to high level and low level, respectively (FIG. 6(c)). The change of the start signal STTZ turns on the nMOS transistors of the first receiver circuits 18a and the third receiver circuits 18b, thereby changing all the switching signals RSWA0-1 and SWA0-63 to low level (FIGS. 6(d), (e)). Similarly, in the memory block MBB, the nMOS transistors of the second receiver circuits 28a and the fourth receiver circuits 28b (FIG. 4) are turned on, thereby changing all the switching signals RSWB0-1 and SWB0-63 to low level (FIGS. 6(f), (g)). The first switching circuits 24a, the second switching circuits 34a, the third switching circuits 24b, and the fourth switching circuits 34b receive the low levels of the switching signals SWA0-63, SWB0-63, RSWA0-1, and RSWB0-1, respectively, and turn on their central nMOS transistors. FIG. 5 seen above shows the state at this time.

Next, the start signal STTPZ changes its state to high level (FIG. 6(h)). In the memory block MBA, the change of the start signal STTPZ makes the selectors 20b output the redundancy setting signals RSA0-1 as the switch control signals RSCA0-1 (relief information) (FIG. 6(i)). The selectors 20a output the redundancy setting signals SA0-63 as the switch control signals SCA0-63 (address information) (FIG. 6(j)). The switching signals RSWA0-1 and SWA0-63 all having changed to the low level, the levels of the switch control signals RSCA0-1 and SCA0-63 are transmitted to the fourth receiver circuits 28b and the second receiver circuits 28a (FIG. 4) in the memory block MBB through the redundancy main word lines RMWLA0-1 and the main word lines MWLA0-63, respectively (FIGS. 6(k), (l)).

The fourth receiver circuits 28b and the second receiver circuits 28a receive the relief information and the address information through the redundancy main word lines RMWLA0-1 and the main word lines MWLA0-63, respectively. The fourth receiver circuits 28b and the second receiver circuits 28a latch the information received, and output the resultant as the redundancy setting signals RSB0-1 and SB0-63, respectively (FIGS. 6(m), (n)). The selectors 30b and 30a output the redundancy setting signals RSB0-1 and SB0-63 as the switch control signals RSCB0-L and SCB0-63, respectively (FIGS. 6(o), (p)).

The switching signals RSWB0-1 and SWB0-63 all having changed to the low level, the levels of the switch control signals RSCB0-1 (relief information) and the switch control signals SCB0-63 (address information) are transmitted to the redundancy main word lines RMWLB0-1 and the main word, lines MWLB0-63, respectively (FIGS. 6(q), (r)). Similarly, the relief information and the address information are transmitted to the subsequent memory blocks (MBC and so on) in succession during the period in which the start signal STTPZ is at high level.

In this way, the address information and the relief information are successively transmitted to adjoining memory blocks MB through the existing main word lines MWL and redundancy main word lines RMWL during the period P1 where the start signal STTPZ is at high level (a predetermined period at power-up). The use of the existing signal lines eliminates the need to provide new signal lines for transmitting the address information and the relief information. Consequently, applying the present invention to any semiconductor memory causes no increase in the number of signal lines or increase in the chip size.

Then, the start signals STTZ and STTX change to low level and high level, respectively. The start signal STTPZ changes its state to low level (FIG. 6(s)). The change of the start signal STTZ turns off all the nMOS transistors of the third receiver circuits 18b. The third receiver circuits 18b output the levels of the redundancy signals RJ0X and RJ1X as the switching signals RSWA0-1, respectively (FIG. 6(t)). Similarly, all the nMOS transistors of the first receiver circuits 18a are turned off. The first receiver circuit 18a corresponding to the main word line MWLA1 outputs the switching signal SWA1 of high level. The first receiver circuits 18a corresponding to the rest of the main word lines MWLA0, 2-63 output the switching signals SWA0, 2-63 of low level, respectively (FIG. 6(u)).

Next, the first switching circuits 24a and the third switching circuits 24b operate according to the switching signals SWA0-63 and RSWA0-1. The outputs from the selectors 20a and 20b of the selecting circuit 20 are then connected to the predetermined main word lines RMWLA0-63 and redundancy main word lines RMWLA0-1, respectively.

Figure 7:
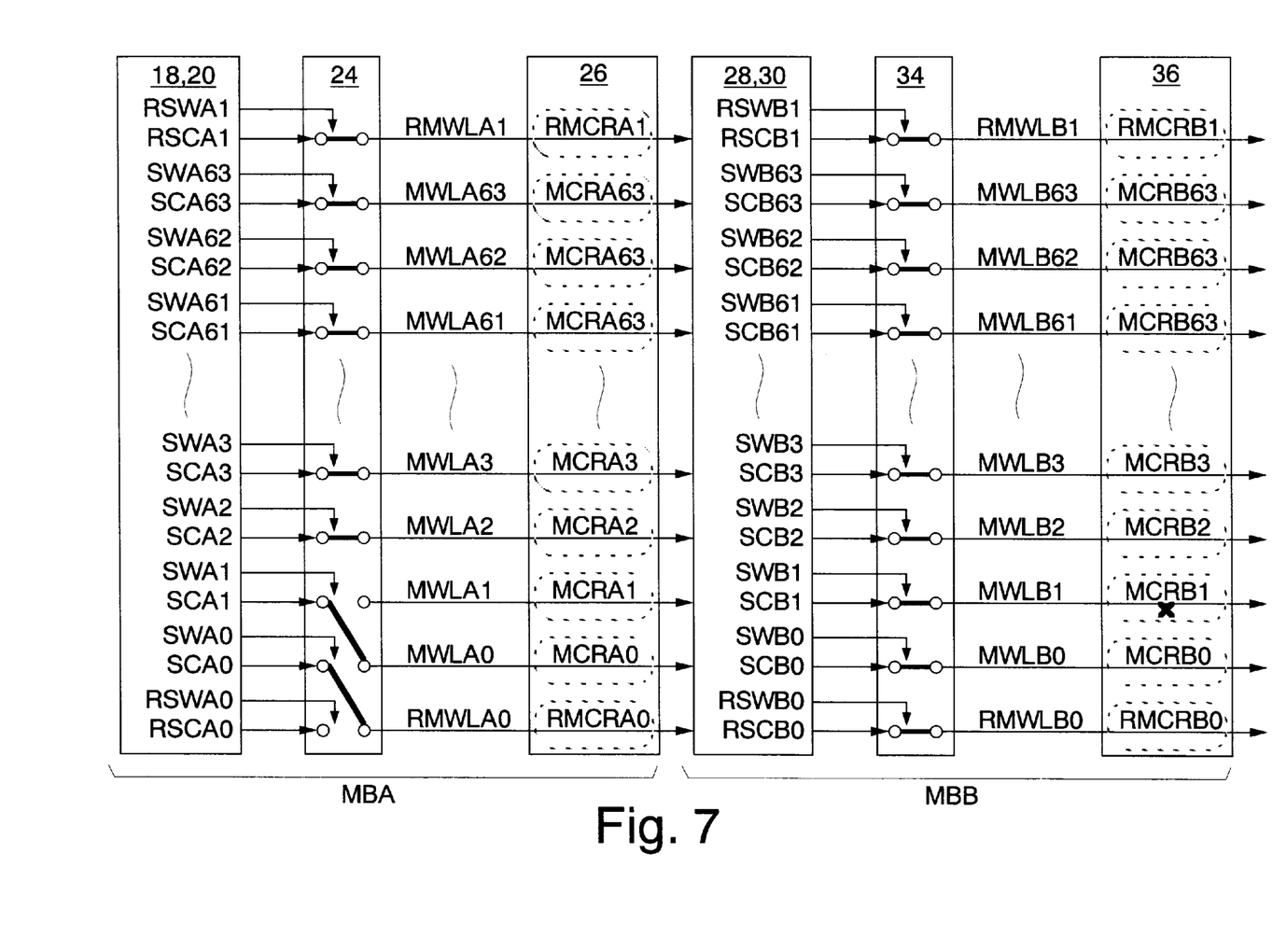
FIG. 7 is an explanatory diagram showing the state of the switching, circuit 24 which is switched according to the switching signals.

FIG. 17 shows the state of the switching circuit 24, which is switched according to the switching signals RSWA0-1 and SWA0-63. The switching circuit 24 connects the signal line of the, switch control signal SCA0 to the redundancy main word line RMWLA0 and the signal line of the switch control signal SCA1 to the main word line MWLA0. The main word line MWLA1 corresponding to the main word line MWLB1 connected to the defective memory cell MC is disconnected. That is, the memory cell row MCRA1 corresponding to the defective memory cell row MCRB1 is disabled. The redundancy memory cell row RMCRA0 is enabled instead of the memory cell row MCRA1. Incidentally, the redundancy main word line RMWLA1 is unused, being supplied with no switch control signal SCA.

Next, in the timing chart shown in FIG. 6, the change of the start signal STTZ to the low level turns off all the nMOS transistors of the fourth receiver circuits 28b. The fourth receiver circuits 28b output the switching signals RSWB0-1, i.e., the inverted levels of the redundancy main word lines RMWLA0-1, respectively (FIG. 6(v)). Similarly, all the nMOS transistors of the second receiver circuits 28a are turned off. The second receiver circuits 28a output the switching signals SWB0-63, i.e., the inverted levels of the main word lines MWLA0-63, respectively (FIG. 6(w)).

Subsequently, the second switching circuits 34a and the fourth switching circuits 34b in the memory block MBB operate according to the switching signals SWB0-63 and RSWB0-1. The outputs from the selectors 30a and 30b of the selecting circuit 30 are then connected to the predetermined main word lines RMWLB0-63 and redundancy main word lines RMWLB0-1, respectively.

Figure 8:
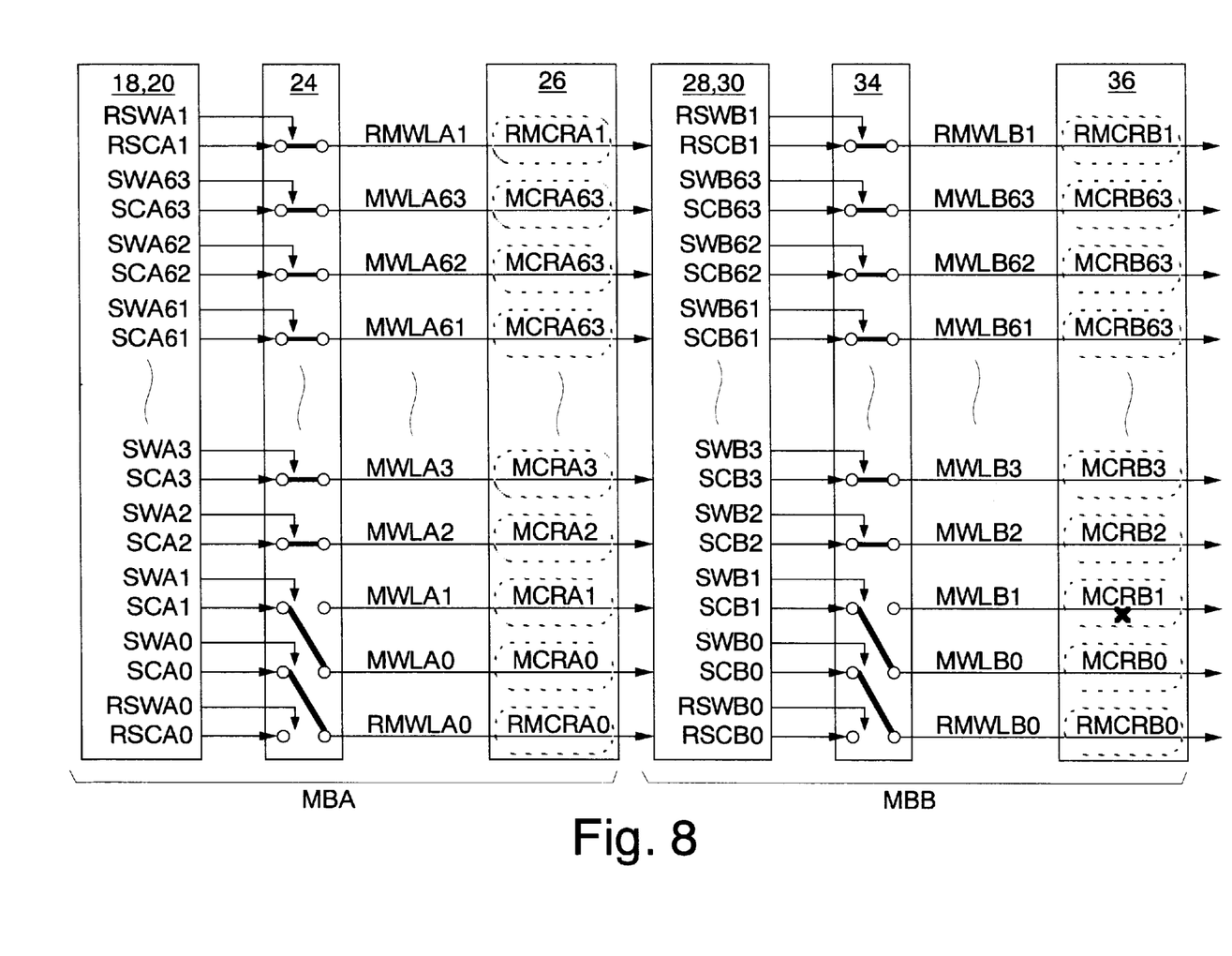
FIG. 8 is an explanatory diagram showing the state of the switching circuit 34, which is switched according to the switching signals.

FIG. 8 shows the state of the switching circuit 34, which is switched according to the switching signals RSWB0-1 and SWB0-63. The state of the memory block MBA is the same as in FIG. 7. The switching circuit 34 connects the signal line of the switch control signal SCB0 to the redundancy main word line RMWLB0 and the signal line of the switch control signal SCB1 to the main word line MWLB0. The main word line MWLB1 connected to the defective memory cell MC is disconnected. That is, the defective memory cell row MCRB1 is disabled, and the redundancy memory cell row RMCRB0 is enabled instead of the redundancy memory cell row MCRB1. Incidentally, the redundancy main word line RMWLB1 is unused, being supplied with no switch control signal SCB.

After the power-on sequence upon applying the power is completed, a read command, a write command, or a refresh command is supplied from the exterior of the DRAM so that a read operation, a write operation, or a refresh operation is performed. Here, the address signal supplied along with the command operates the address receiver circuits 20 and 30, whereby predetermined main word lines MWL (MWLA, MWLB) or redundancy main word lines RMWL (RMWLA, RMWLB) are selected according to the address signal.

Figure 9:
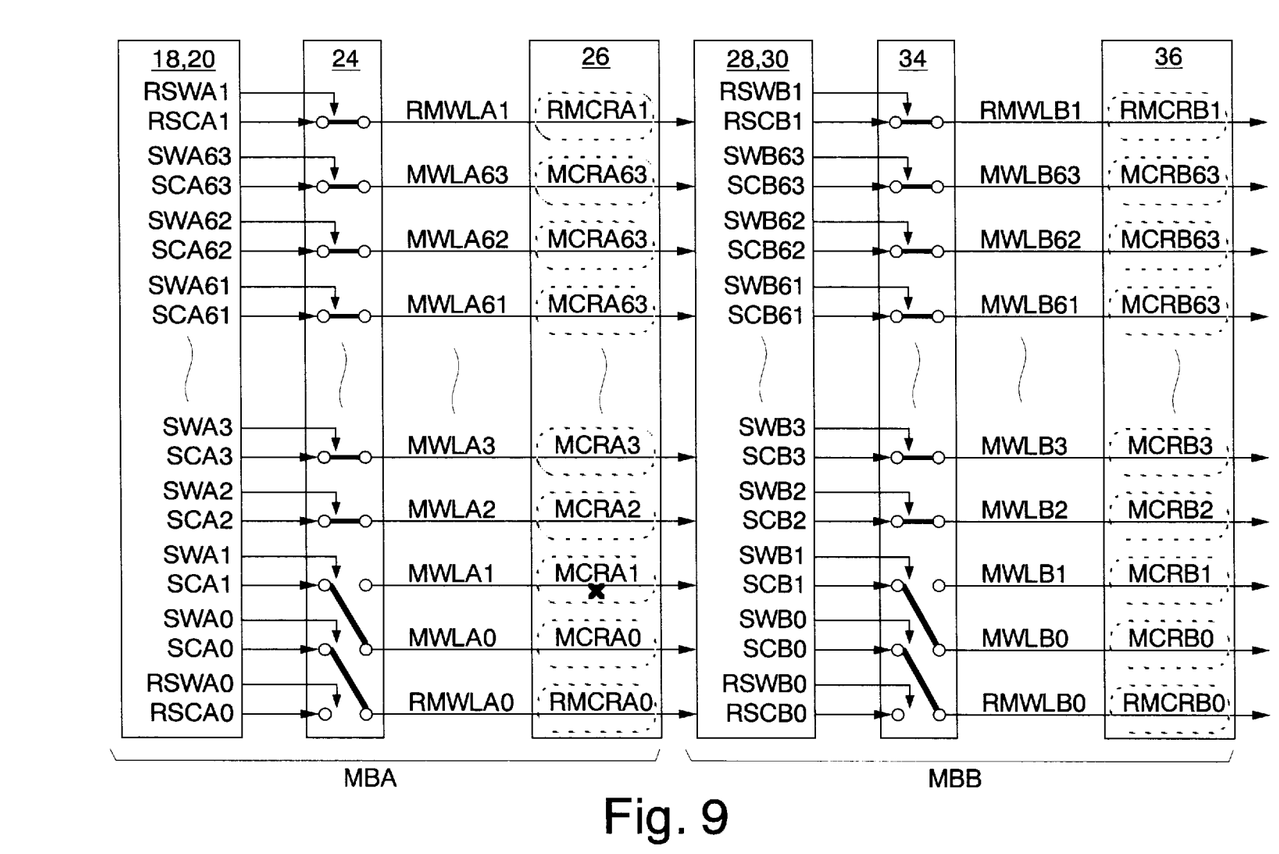
FIG. 9 is an explanatory diagram showing a state where the memory block MBA suffers a defect.

FIG. 9 shows a state after the operation of the switching circuits 24 and 34 when a defect occurs in the memory block MBA. In this example, the memory cell row MCRA1 of the memory block MBA suffers a defective memory cell (indicated with a cross in the diagram). Here, the fuse array 10 is programmed with the same address information as that described in FIG. 6. Then, the switching circuits 24 and 34 make the same operations as in FIG. 8.

Figure 10:
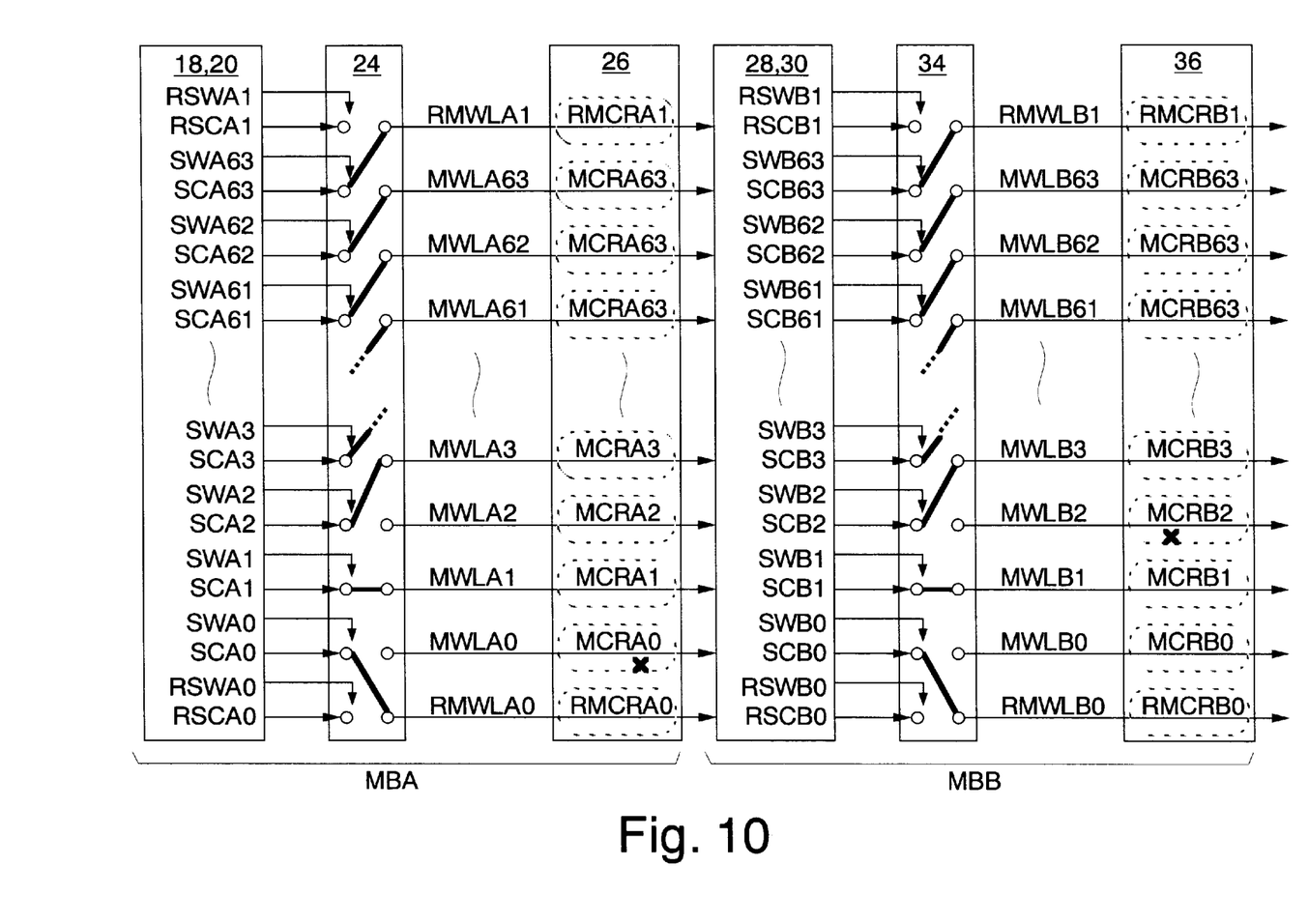
FIG. 10 is an explanatory diagram showing a state where the memory blocks MBA and MBB both suffer a defect.

FIG. 10. shows a state after the operation of the switching circuits 24 and 34 when the memory blocks MBA and MBB both suffer a defect. In this example, the memory cell row MCRA0 in the memory block MBA and the memory cell row MCRB2 in the memory block-MBB have defective memory cells (indicated with crosses in the diagram). Here, the fuse array 10 is programmed with the address of the defective memory cell row MCRA0. The fuse array 12 is programmed with the address of the defective memory cell row MCRB2.

As has been described above, according to the present embodiment, the fuse arrays 10 and 12 can be shared among all the memory blocks MB. This eliminates the need to form a fuse array with respect to each memory block MB. As a result, it is possible to decrease the number of fuse arrays 10 and 12. The fuses to constitute the fuse arrays 10, 12 are greater in size than transistor devices. Hence, the smaller number of fuse arrays 10, 12 allows a significant reduction in the chip size of the DRAM.

The address information and the relief information are transmitted by using the existing main word lines MWL and redundancy main word lines RMWL. This eliminates the need for new wiring for transmitting the address information and the relief information. The existing main word lines MWL and redundancy main word lines RMWL can be used to transmit the address information to all the memory blocks MB. Hence, applying the present invention to any semiconductor memory can prevent the number of lines from increasing, thereby avoiding an increase in the chip size resulting from increased wiring.

The second and fourth receiver circuits 28a and 28b are provided with the latches for latching the address information and the relief information. Consequently, even after the transmission of the address information and the relief information to adjoining other memory blocks MB, the held address information and relief information can be used to disable defective memory cell rows MCR and enable redundancy memory cell rows RMCR. In addition, the presence of the latches makes it unnecessary to receive the address information and the relief information directly from the fuse arrays 10 and 12.

There are provided the first, second, third, and fourth switching circuits 24a, 34a, 24b, and 34b which function as transmission paths during the predetermined period P1 at power-up and function as switches in the subsequent period P2. The address information and the relief information can thus be transmitted to adjoining other memory blocks MB by simple circuitry. Besides, the address information and the relief information can be used to disable defective memory cell rows MCR and enable redundancy memory cell rows RMCR.

The memory blocks MB are aligned in one direction along the wiring direction of the main word lines MWL and the redundancy main word line RMWL. The address information and relief information output from the fuse arrays 10 and 12 can thus be transmitted only in one direction through the word lines MWL and RMWL. Consequently, the layout region of the wiring for transmitting the address information and relief information between, the memory blocks MB can be minimized, with a reduction in the chip size of the semiconductor memory.

Incidentally, the foregoing embodiment has dealt with the case where the present invention is applied to a DRAM. However, the present invention is not limited to such an embodiment. For example, the present invention may be applied to a DRAM core to be implemented on a system LSI.

The foregoing embodiment has dealt with the case where the address information and the relief information are transferred to adjoining memory blocks MB through the main word lines MWL and the redundancy main word lines RMWL. However, the present invention is not limited to such an embodiment. For example, the address information and the relief information may be transferred through column lines and redundancy column lines, which, operate column switches for connecting bit lines and data, bus lines.

The invention is not limited to the above embodiments and various modifications may be made without departing from the spirit and scope of the invention. Any improvement may be made in part or all of the components.

What is claimed is:

1. A semiconductor memory comprising:
   a plurality of memory blocks operating at different timings from one another, each including a plurality of memory cell rows containing memory cells and a redundancy memory cell row containing redundancy memory cells for relieving a defective memory cell row out of said memory cell rows;
   a redundancy memory circuit including a first memory unit for storing as address information a defect address indicating said defective memory cell row existing in any one of said memory blocks; and
   a redundancy control circuit for receiving said address information, disabling said defective memory cell row corresponding to said defect address stored in said redundancy memory circuit and enabling said redundancy memory cell row in said memory block including said defective memory cell row, and disabling said memory cell rows corresponding to said defective memory cell row and enabling said redundancy memory cell rows in the rest of said memory blocks, wherein:
   said memory cell rows each include a selecting line for selecting said memory cells; and
   said redundancy control circuit includes
       a first receiver circuit for, firstly and directly receiving said address information stored in said first memory unit and a first switching circuit for disabling one of said memory cell rows according to said address information received, said first receiver circuit and said first switching circuit being formed in one of said memory blocks, and
       a second receiver circuit for receiving said address information transmitted through said selecting line of the memory block which has firstly and directly received said address information and a second switching circuit for disabling one of said memory cell rows according to said address information received, said second receiver circuit and said second switching circuit being respectively formed in said memory blocks other than one having said first receiver circuit and said first switching circuit.

2. The semiconductor memory according to claim 1, wherein
   said first memory unit of said redundancy memory circuit includes a plurality of fuses in which respective bits of said defect address are programmed.

3. The semiconductor memory according to claim 1, wherein
   each of said memory blocks including said second receiver circuit transmits said address information through said selecting line to another one of said memory blocks including said second receiver circuit.

4. The semiconductor memory according to claim 1, wherein:
   said first receiver circuit includes a redundancy decoder for decoding said address information; and
   said second receiver circuit includes a latch for holding said address information transmitted through said selecting line.

5. The semiconductor memory according to claim 1, wherein
   said first and second switching circuits transmit said address information to said selecting line during a predetermined period at power-up, and subsequently disable said defective memory cell row according to said address information.

6. The semiconductor memory according to claim 1, wherein said selecting line is a word line connected to transfer gates of said memory cells.

7. The semiconductor memory according to claim 1, wherein:

said memory blocks are aligned in a wiring direction along said selecting line; and one of said memory blocks including said first receiver circuit is positioned closer to said redundancy memory circuit than the rest of said memory blocks.

8. The semiconductor memory according to claim 1, wherein:

said redundancy memory cell row includes a redundancy selecting line for selecting said redundancy memory cells;

said redundancy memory circuit includes a second memory unit for storing relief information indicating that said first memory unit stores said address information; and said redundancy control circuit includes a third receiver circuit for firstly and directly receiving said relief information stored in said redundancy memory circuit and a third switching circuit for enabling said redundancy memory cell row according to said relief information received, said third receiver circuit and said third switching circuit being formed in one of said memory blocks having said first receiver circuit, and a fourth receiver circuit for receiving said relief information transmitted through said redundancy selecting line of the memory block which has firstly and directly received said relief information and a fourth switching circuit for enabling said redundancy memory cell row according to said relief information received, said fourth receiver circuit and said fourth switching circuit being respectively formed in said memory blocks each having said second receiver circuit.

9. The semiconductor memory according to claim 8, wherein each of said memory blocks including said fourth receiver circuit transmits said relief information through said redundancy selecting line to another one of said memory blocks including said fourth receiver circuit.

10. The semiconductor memory according to claim 8, wherein said fourth receiver circuit includes a latch for holding said relief information transmitted through said redundancy selecting line.

11. The semiconductor memory according to claim 8, wherein said third and fourth switching circuits transmit said relief information to said redundancy selecting line during a predetermined period at power-up, and subsequently enable said redundancy memory cell row according to said relief information.

12. The semiconductor memory according to claim 8, wherein said redundancy selecting line is a redundancy word line connected to transfer gates of said redundancy memory cells.

13. The semiconductor memory according to claim 8, wherein said second memory unit of said redundancy memory circuit includes a fuse in which said relief information is programmed.

* * * * *